United States Patent [19]

Kasama et al.

[11] Patent Number: 5,003,263
[45] Date of Patent: Mar. 26, 1991

[54] IMAGE RECONSTRUCTION METHOD FOR A MAGNETIC RESONANCE IMAGING DEVICE AND A DEVICE FOR REALIZING SAME

[75] Inventors: Takashi Kasama, Yokohama; Akira Maeda, Sagamihara; Tetsuo Yokoyama, Tokyo; Hiroshi Nishimura, Kashiwa, all of Japan

[73] Assignees: Hitachi, Ltd., Hitachi Medical Corporation; Hitachi Microcomputer Engineering Ltd., both of Tokyo, Japan

[21] Appl. No.: 443,500

[22] Filed: Dec. 1, 1989

[30] Foreign Application Priority Data

Dec. 14, 1988 [JP] Japan .................. 63-313907

[51] Int. Cl.$^5$ .................. G01R 33/20
[52] U.S. Cl. .................. 324/309; 324/307
[58] Field of Search .................. 324/300, 306, 307, 309, 324/313, 314, 318, 322; 128/653 A

[56] References Cited

U.S. PATENT DOCUMENTS

| 4,661,775 | 4/1987 | Kormos et al. | 324/307 |
| 4,703,270 | 10/1987 | Hall et al. | 324/309 |
| 4,727,324 | 2/1988 | Bendall et al. | 324/309 |
| 4,803,431 | 2/1989 | Sano et al. | 324/306 |
| 4,885,542 | 12/1989 | Yao et al. | 324/313 |

OTHER PUBLICATIONS

"MR Image Reconstruction from Half of the Data Using a Phase Map", The Institute of Electronics Information and Communications Engineers, Report D, vol. J71-D, No. 1, pp. 182-187.

Primary Examiner—Michael J. Tokar
Attorney, Agent, or Firm—Antonelli, Terry, Stout & Kraus

[57] ABSTRACT

An image reconstruction method for a magnetic resonance imaging device is disclosed, by which phase distortions of a magnetic resonance signal are stored in the form of a table prepared previously, by using a phase encode amount and an imaging region size as parameters; the phase distortions of the magnetic resonance signal are corrected on the basis of the phase distortions stored in the table for the measured magnetic resonance signal or the phase distortions varying for every line are presumed from the difference in the phase between the phase of hypothetical data including no phase distortions and the phase of measured data; and the phase distortions of the measured magnetic resonance signal are corrected by using this presumed value.

18 Claims, 5 Drawing Sheets

F(y) TABLE

G(y) TABLE

IMAGE RECONSTRUCTION METHOD FOR A MAGNETIC RESONANCE IMAGING DEVICE AND A DEVICE FOR REALIZING SAME

BACKGROUND OF THE INVENTION

The present invention relates to a method for correcting phase distortions produced for every line (for every phase encode: a set of one-dimensional data measured at each step of the phase encode is called one line) in signals measured by means of a magnetic resonance imaging device and a device for realizing same.

Heretofore, as disclosed in JP-A-Sho 61-187850, with respect to the phase distortion in the detection signal, the object of correction was offset phase distortions having a constant value, remaining unchanged for different lines and phase distortions, which similarly thereto, remain unchanged for every line, but vary linearly on the image.

FIG. 1 is a scheme indicating the principle of the generation of phase distortions, which are the object of the present invention.

When the intensity of the applied gradient magnetic field is increased in order to shorten the imaging time, magnetic influences, in the form of noises due to the eddy current effect, etc., largely appear. The degree of these magnetic influences dependently varies on the intensity of the gradient magnetic field. As the result, the pulse of the read-out gradient magnetic field $G_x$ varies as indicated by an arrow 14 and corresponding thereto, the point of time, where the area thereof is equal to the area S1 of a pulse 11, varies also, as indicated by a pulse 12 or 13. As the result, the point of time at the occurrence of the peak in the resonance signal varies also as indicated by an arrow 15. For this reason, supposing that the period of time $T_E$ from the point of time of the application of an RF 90° pulse to the detection of the resonance signal is constant, it is impossible to detect always the peak of the resonance signal.

As the result, the phase of the detection signal includes phase distortions varying for every line, which caused blurry picture to produce deterioration of the image quality.

Heretofore, since the intensity of the gradient magnetic field was low, the amount of variations in the read-out gradient magnetic field $G_x$ indicated by the arrow 14 was ignorable. However, when the intensity of the gradient magnetic field was increased, the amount of variations varied for every line. Therefore it was a serious problematical point to be solved that phase distortions varying for every line took place.

SUMMARY OF THE INVENTION

The object of the present invention is to eliminate the blurry picture to improve the image quality by correcting the phase distortions varying for every line.

The above object can be achieved by the means described below. At first the detection signal obtained by the magnetic resonance imaging device is subjected to a horizontal (x-direction) one-dimensional Fourier transformation. Next, the generation pattern of the phase distortions varying for every line having been previously obtained to be arranged in the form of a table, the phase distortions varying for every line are corrected on the basis thereof. Or the phase distortions are obtained from the difference between data presumed as ideal hypothetical data including no phase distortions and real measured data and the phase distortions varying for every line are corrected on the basis thereof. Then the signal is subjected to a vertical (y-direction) one-dimensional Fourier transformation to obtain a reconstructed image having no blurry picture.

Mathematical formulas used for the correction according to the present invention will be explained.

FIG. 2 shows formulas expressing measured data. Data obtained by subjecting the hypothetical data $S_0(x, y)$ having no phase distortions to the xdirection one-dimensional Fourier transformation can be expressed by Eq. (1);

$$Z(I, y) = \int S_0(x, y)e^{ilx} dx \quad (1)$$
$$i = \sqrt{-1}$$
$$I = 1 \sim 256$$

where i is the imaginary unit and $I = 1$ to 256.

Next the formula $Z(I, y)$ is subjected to the y-direction Fourier transformation to obtain image data as follows;

$$B_0(I, K) = \int z(I, y)e^{iky} dy \quad (2)$$

All of $S_0(x, y)$, $Z(I, y)$, $B_0(I, K)$ are formulas, when there are no phase distortions.

Now the case where they include phase distortions will be explained. The phase distortions are defined as follows;

F(y) : phase distortions varying linearly on the image with a same rate, depending on the position in the x-direction, and G(y) : offset phase distortions, which are constant over the whole phase of the data.

Then the formula including distortions after the x-direction Fourier transformation is expressed by;

$$A(I, y) = Z(I, y) \cdot e^{i(F(y) \cdot I + G(y))} \quad (3)$$

The image data is obtained by subjecting Eq. (3) to the y-direction Fourier transformation as follows;

$$B(I, K) = \int A(i, y) \cdot e^{iKy} dy \quad (4)$$
$$= \int Z(I, y) \cdot e^{i(Ky + F(y) \cdot I + G(y))} dy$$

(a) If $F(y) = G(y) = 0$, $B(I, K) = B_0(I, K)$, which means that there are no phase distortions.

(b) If $F(y) = 0$, $G(y) = P_0$:constant, $$B(I, K) = B_0(I, K) \cdot e^{iP_0} \quad (5)$$

which represents the image data including offset phase distortions, which don't vary for different lines, i.e. causes no blurry picture.

(c) If $F(y) = 0$, $G(y) = P_1 y$:linear function, $$B(I, K) = \int Z(I, y) \cdot e^{i(Ky + P_1 y)} dy \quad (6)$$
$$= \int Z(I, y) \cdot e^{i(K + P_1)y} dy$$
$$= B_0(I, K + P_1)$$

In this case, the image data represent an image positionally deviated by $P_1$, as indicated in FIG. 3A, and cause no blurry picture.

(d) If $F(y)=0$, $G(y)=P_1y^2$: even function, $$B(I, k) = \int Z(I, y) \cdot e^{i(Ky+P_1y^2)} dy \qquad (7)$$
$$= \int Z(I, y) \cdot e^{i(K+P_1y)y} dy$$

If a variable term such as $P_1y$ is contained in the exponent, it causes blurry picture.

(e) If $F(y)=a$: constant, $G(y)=0$, $$B(I, k) = \int Z(I, y) \cdot e^{i(Ky+aI)} dy \qquad (8)$$
$$= \int Z(I, y) \cdot e^{iKy} dy \cdot e^{iaI}$$
$$= B_0(I, K) \cdot e^{iaI}$$

In this case, the image data includes phase distortions proportional to the position of I, which causes no blurry picture.

(f) If $F(y)=by$; $G(y)=0$, $$B(I, k) = \int Z(I, y) \cdot e^{i(Ky+byI)} dy \qquad (9)$$
$$= \int Z(I, y) \cdot e^{i(K+bI)y} dy$$
$$= B_0(I, K + bI)$$

In this case, an image including no phase distortions indicated by a broken line in FIG. 3B gives rise to image data including certain positional distortions as indicated by a full line, which causes no blurry picture.

(g) If $F(Y)=Y^2$, $G(Y)=0$, $$B(I, k) = Z(I, y) \cdot e^{i(Ky+y^2I)} dy \qquad (10)$$
$$= Z(I, y) \cdot e^{i(K+yI)y} dy$$

In this case, just as by Eq. (7), since a variable $yI$ is contained in the exponent, the phase distortions cause blurry picture.

From the result described above, it can be understood that if $F(y)$ or $G(y)$ varies non-linearly, particularly in an quadratic function, the phase distortions cause blurry picture. Consequently the correction can be effected by obtaining $F(y)$ and $G(y)$ to return the phase to the initial value. The data after the x-direction Fourier transformation after the correction can be expressed, by inverting the sign of the exponent to minus in order to return the phase to the initial value, by;

$$A'(I, y) = A(I, y) \cdot e^{-i(F(y) \cdot I + G(y))} \qquad (11)$$

Further, by subjecting it to the y-direction Fourier-transformation, the image data, for which the phase distortions varying for every line to cause the blurry picture are corrected, are obtained.

By the first correcting method, if $F(y)$ and $G(y)$ are known, the amount of the phase distortions varying for every line is arranged in the form of a table, the correction being effected by using it.

By the second correcting method, the phase distortions varying for every line are obtained, starting from the difference between the phase of the real measured data and the phase of the data presumed by forming the complex conjugate on the basis of the hypothetical data $Z(I, y)$ including no phase distortion, and added in the I direction to obtain the average value. The correction of the phase distortions is effected by using this arithmetic average.

By the second correcting method, since the blurry picture is primary produced by distortions of quadratic function (even function), it is utilized that the amount of correction for the lower half of the data can be applied also to the upper half of the data.

DESCRIPTION OF THE PREFERRED EMBODIMENTS

Figure 1:
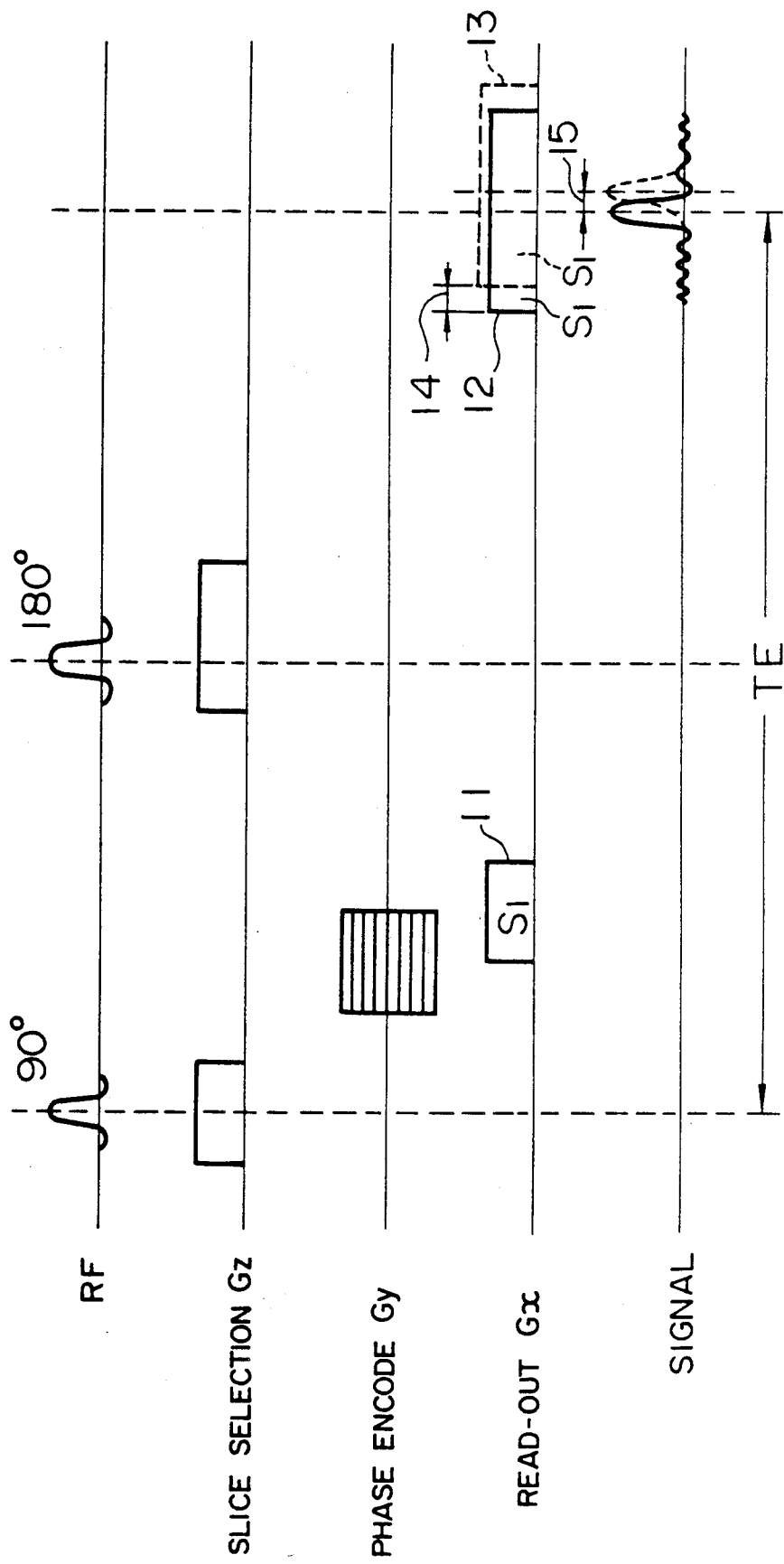
FIG. 1 is a scheme indicating the principle of the generation of phase distortions.
Figure 2:
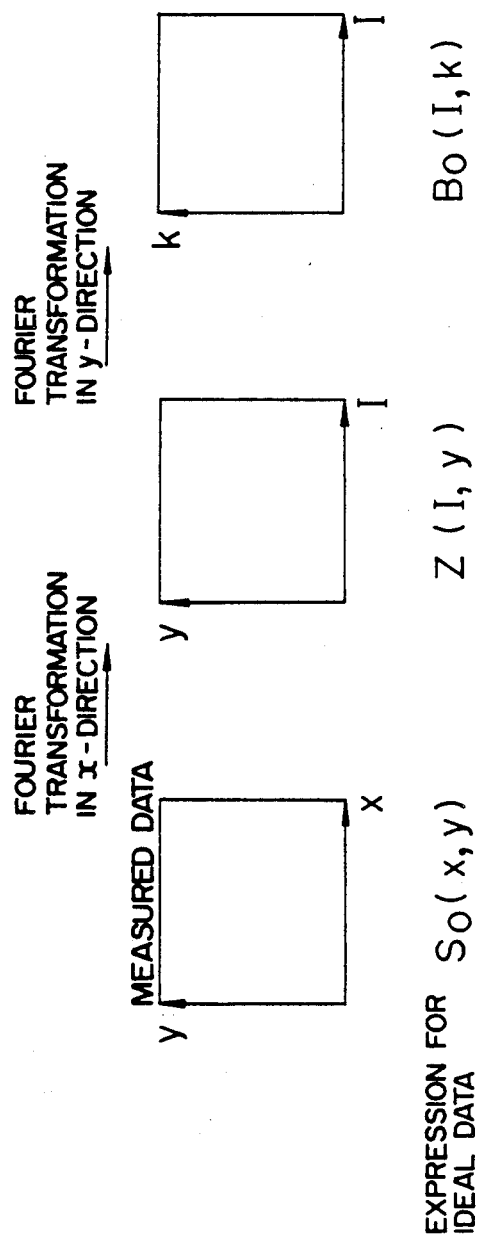
FIG. 2 shows the relation between formulas expressing measured data and variables.
Figure 3B:
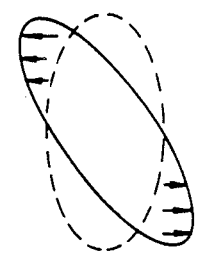
FIGS. 3A and 3B show images including phase distortions.
Figure 3A:
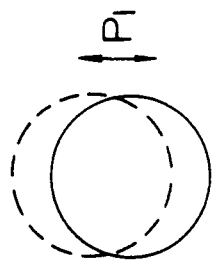
Figure 4:
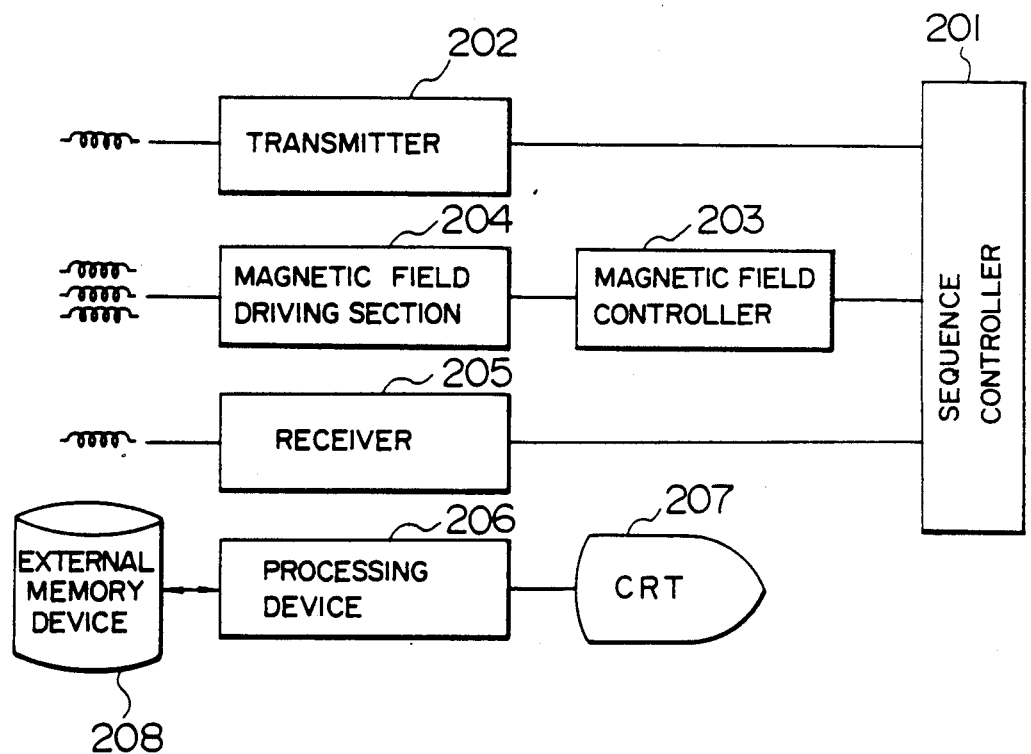
FIG. 4 is a block diagram indicating the construction of an MRI device according to the present invention.

Hereinbelow an embodiment of the present invention will be explained. FIG. 4 is a block diagram indicating the construction of an MRI device for realizing the present invention. In order to detect a nuclear magnetic resonance signal from an object to be examined, it consists of a sequence controller 201 controlling various parts of the device according to a predetermined procedure, a transmitter 202 transmitting high frequency magnetic field pulses generated in order to give rise to a resonance, a gradient magnetic field driving section 204 driving the gradient magnetic field and a magnetic field controller 203 controlling it, a receiver 205 receiving and detecting nuclear magnetic resonance signals generated by the object to be examined, a processing device 206 executing various sorts of operations including image reconstruction and phase distortion correcting processing, etc., a CRT display device 207 for image display, and an external memory device 208 for storing detection signal data, image reconstruction data, etc.

Figure 5:
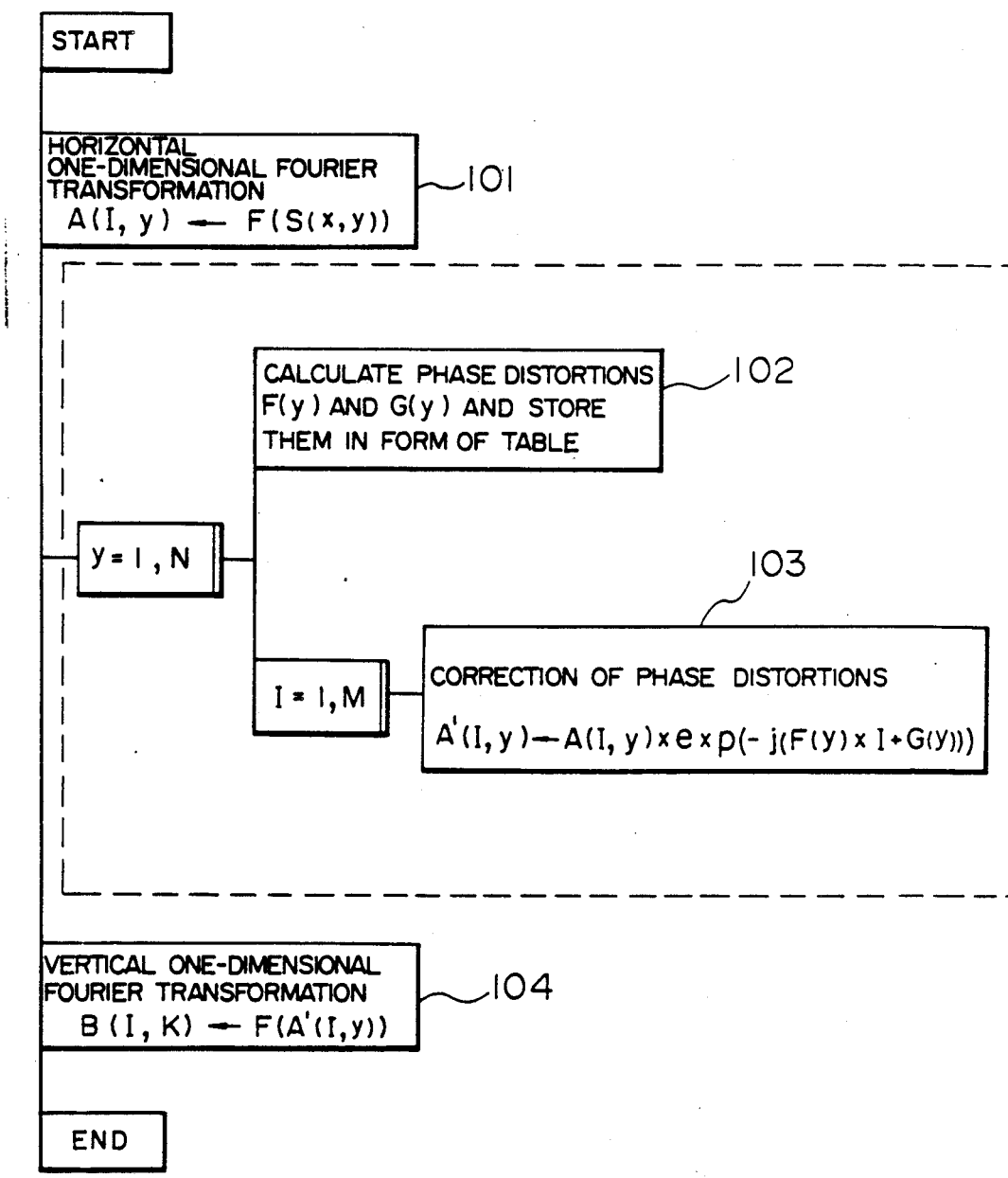
FIG. 5 is a flow chart of an embodiment of the present invention.

FIG. 5 shows a flow chart of the first embodiment for correcting blurry picture on the image reconstructed from measured data in the construction described above.

Step 101: measured data $S(x, y)$ are subjected to an x-direction one-dimensional Fourier-transformation to obtain $A(I, y)$.

Step 102: here phase distortions varying depending on the position in the y-direction, are obtained. There are two sorts of phase distortions, i.e. phase distortions $F(y)$, by which the phase varies linearly in the I direction on the image, and offset phase distortions $G(y)$, which has a constant value over the whole data in the phase of the data, both of them being represented as functions of y. When the value of y increases, the phase encode amount increases regularly and $F(y)$ and $G(y)$ vary also correspondingly. Since $F(y)$ and $G(y)$ vary, depending on the phase encode amount and the magnitude of the imaging region, it is obtained in advance how $F(y)$ and $G(y)$ vary, which are arranged in the form of a table. At the phase correction, the correction is effected, referring to values in the table corresponding to each of the lines.

Figure 6A:
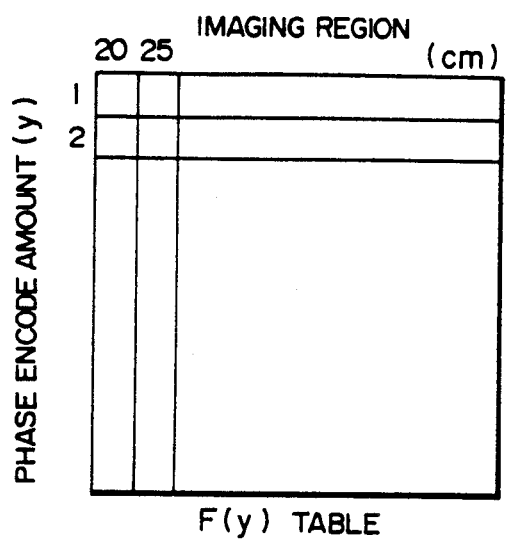
FIGS. 6A and 6B show embodiments of the phase distortion table.
Figure 6B:
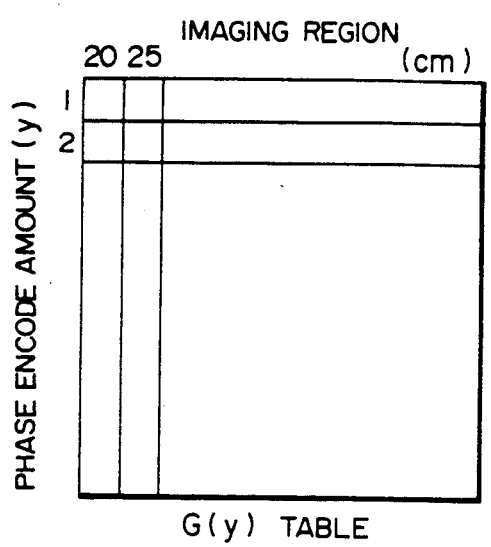

FIGS. 6A and 6B show examples of the structure of the table, in which the column indicates the phase encode amount and the line indicates the magnitude of the imaging region. For example, in the hatched section in FIG. 6B is stored the value of the offset phase distortions, when the size of the imaging region is 25 cm and the phase encode value is 2.

Step 103: the correction of the phase distortions is effected by using Eq. (11) on the basis of the phase distortions obtained by Step 102.

Step 104: data $A'(I, y)$ obtained by Step 103 are subjected to the y-direction one-dimensional Fourier transformation to obtain an image $B'(I, K)$, for which blurry picture is corrected.

Further, if e.g., starting from only the value $G(y)$ of the column of an imaging region of 20 cm, $G(y)$ of another imaging region is calculated, using the relationship between the magnitude of the imaging region and the phase encode amount, i.e. the inverse proportional relationship that $\frac{1}{2}$ of the phase encode amount is sufficient, when the magnitude of the imaging region is doubled, it is unnecessary to store the value of the phase encode amount corresponding to the other imaging region. That is, it is sufficient for the two-dimensional table indicated in FIG. 6A or 6B to have only the value $G(y)$ of the column of the imaging region of 20 cm and therefore it is possible to make the table one-dimensional.

Figure 7:
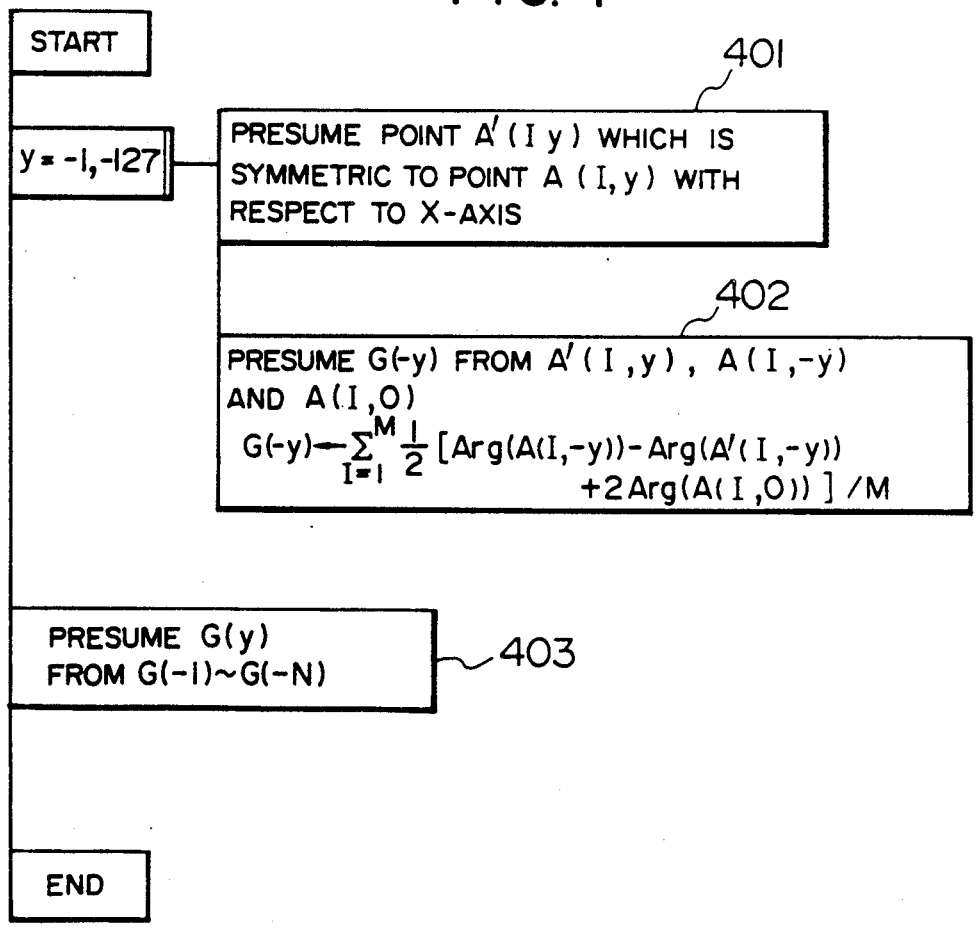
FIG. 7 is a flow chart indicating the processing for obtaining phase distortions $G(y)$, starting from data presumed on the basis of data including no phase distortions and real measured data.

In the first embodiment the phase distortions were corrected by arranging $F(y)$ and $G(y)$ in the form of a table, supposing that $F(y)$ and $G(y)$ were previously known. Now a second embodiment will be shown, in which the phase distortions are corrected by presuming $G(y)$ from the value presumed on the basis of the data including no phase distortions and the real measured data. At this time, it is supposed that $F(y)$ is known and constant. Further, since it is mainly the even function component of $G(y)$ that causes the blurry picture, here $G(y) = G(-y)$ is valid. FIG. 7 shows a processing flow chart for presuming $G(y)$.

The presumption of $G(y)$ indicated in FIG. 7 is conceived under the condition that distortions produced by the device have no influences; that the image data are represented by real numbers; and that two sets of data, which are symmetric with respect to the X axis, can be represented by complex numbers, which are conjugate to each other. The processing flow chart indicated in FIG. 7 correspond to Step 102 in FIG. 5. The data including no phase distortions in the region $y<0$ is presumed by using the complex conjugate from the data in the region $y \geq 0$ among the data obtained by subjecting the hypothetical data including no phase distortions to the x-direction one-dimensional Fourier Transformation. Next it is possible to obtain the phase distortions $G(y)$ by using the phase of the real measured data, the phase of the presumed data and the phase at the origin $y=0$. In this way it is possible to correct the phase distortions by using Eq. (11), starting from the obtained $G(y)$ and the known $F(y)$.

Step 401

The data, which have been subjected to the x-direction one-dimensional Fourier transformation, can be expressed as follows, in which it is supposed that $-128 \leq y \leq 127$, the origin being at $y=0$. Further it is supposed that $F(y) = F(0)$: constant. Eq. (3) is transformed into:

$$A(I, y) = Z(I, y)e^{i(F(o)I + G(y))} \tag{12}$$

Since the image should be represented originally by real numbers, it can be expressed by Eq. (13);

$$Z(I, -y) = Z^*(I, y) \tag{13}$$

where "*" represents a complex conjugate operator. That is, it is possible to presume the data for $y>0$ from the data for $y \geq 0$. In this case, if the data for $y<0$ are presumed from the data for $y \geq 0$ by the complex conjugate for the formula $A'(I, -y)$ after the phase distortion correction.

$$\begin{aligned} A'(I, -y) &= A^*(I, y) \\ &= Z^*(I, y) e^{-i(F(0)I + G(y))} \\ &= Z(I, -y) e^{-i(F(0) \cdot I + G(y))} \end{aligned} \tag{14}$$

is obtained.

Since there exist distortions in $A(I, y)$, differing from $Z(I, y)$, the presumed value $A'(I, -y)$ obtained by correcting the phase distortions and the formula $A(I, -y)$ including the phase distortions are not equal. It is possible to obtain the phase distortion $G(y)$ by forming the difference therebetween. Step 402

In this step 402 the phase distortions $G(y)$ are obtained, starting from the difference between the phase of $A(I, -y)$ and the phase of $A'(I, -y)$. Denoting the function, by which the phase is formed, by Arg, since $$Arg(A(I, -y)) = F(0)I + G(-y) + Arg(Z(I, -y)) \tag{15}$$

$$Arg(A'(I, -y)) = -\{F(0) \cdot I + G(y)\} + Arg(Z(I, -y)) \tag{16}$$

$$Arg(A(I, 0)) = -F(0) \cdot I \tag{17}$$

{Phase of $A(I, -y)$ — phase of $A'(I, -y)$} is given by;

$$Arg(A(I, -y)) - Arg(A'(I, -y)) = G(y) + G(-y) + 2F(0) \cdot I \tag{18}$$

Eq (18) can be transformed into;

$$G(y) + G(-y) = Arg(A(I, -y)) - Arg(A'(I, -y)) + 2Arg(A(I, 0)) \tag{19}$$

Since $G(y)$ is an even function, $G(y) = G(-y)$ is valid. Consequently, from Eq. (19)

$$G(-y) = \tfrac{1}{2}[Arg\, A(I, -y) - Arg(A'(I, -y)) + 2Arg(A(I, 0))] \tag{20}$$

is obtained.

In order to reduce further the effect of noise and to improve the precision of the presumption, the values obtained by using the formula described above are added to obtain the average thereof and the phase distortions $G(-y)$ is obtained by using the following equation;

$$G(-y) = \tag{21}$$

$$\frac{\sum_{I=1}^{256} (\tfrac{1}{2}[Arg(A(I, -y)) - Arg(A'(I, -y)) + 2Arg(A(I, 0))])}{256}$$

Step 403; Here G(y) is presumed by using the values from G(−1) to G(−127) obtained by Step 402. For the presumption there are known the method, by which the procedure is modeled by e.g. $G(y) = \alpha y^2$ and $\alpha$ is presumed by the method of least squares, etc.

It is possible to correct the phase distortions according to eq. (11) by using G(y) presumed by the processing described above and F(y) already known.

Further this correction of the phase distortion may be effected in the state where the hypothetical data and the measured data are not subjected to the horizontal one-dimensional Fourier transformation.

Still further, although the object of the present embodiment was the correction of the phase distortions for two-dimensional data, it can be easily inferred that this process can be applied also to three-dimensional data.

In the processing described above it was supposed that $Z(I, -y) = Z^*(I,y)$. However, in practice, it can happen that the reconstructed image is not expressed by real numbers because of influences of distortions of the device and this symmetricity is not valid. However, even in this case, as a method, by which the data for $y<0$ is presumed from the data for $y \geq 0$, there is known a method disclosed in "MR Image Reconstruction from Half of the Data Using a Pulse Map" by SANO, et al. (in Japanese), Journal of the Institute of Electronics Information and Communication Engineers D. Vol. J-71-D, No. 1, pp. 182-187 (1988). It is possible to improve further the precision of the presumption of G(y) by using this MRI image construction algorism from half of measured data in the presumption of $A'(I, -y)$.

We claim:

1. An image reconstruction method for a magnetic resonance imaging device comprising:
   (a) a step of storing phase distortions of a magnetic resonance signal in the form of a table prepared previously, by using a phase encode amount and an imaging region size as parameters;
   (b) a step of correcting the phase distortions of said magnetic resonance signal on the basis of the phase distortions stored in said table for the measured magnetic resonance signal; and
   (c) a step of reconstructing an image, starting from said magnetic resonance signal thus corrected.

2. An image reconstruction method according to claim 1, wherein said storing step includes a step of storing offset phase distortions differing for every line and/or phase distortions, which differ for different lines and vary linearly on the image and said correcting step includes a step of executing an operation for returning the amount of rotation of the phase appearing as said phase distortions to the original value.

3. An image reconstruction method according to claim 1, wherein said storing step includes a step of calculating the phase distortions corresponding to another imaging region size, starting from said phase distortions corresponding to different phase encode amounts belonging to said same imaging region size.

4. An image reconstruction method for a magnetic resonance imaging device comprising:
   (a) a step of presuming data for $y<0$ by obtaining a complex conjugate from data for $y \geq 0$ among hypothetical data of a magnetic resonance signal including no phase distortions;
   (b) a step of obtaining the phase of said presumed data;
   (c) a step of obtaining the phase of said measured data in said region of $y<0$ in the real measured data of said magnetic resonance signal;
   (d) a step of obtaining the difference between the phase of said presumed data and the phase of said measured data;
   (e) a step of obtaining first phase distortions of said measured data in said region of $y<0$, starting from said difference;
   (f) a step of obtaining second phase distortions of said measured data in said region of $y \geq 0$, starting from said first phase distortions;
   (g) a step of correcting said phase distortions of said measured data by using said first phase distortions and second phase distortions; and
   (h) a step of reconstructing an image by using said measured data thus corrected.

5. An image reconstruction method according to claim 4, wherein said correcting step includes a step of executing an operation for returning the amount of rotation of the phase appearing as said phase distortions to the original value.

6. An image reconstruction method according to claim 4, wherein said step of obtaining said first phase distortions includes a step of obtaining offset phase distortions differing for every line and/or phase distortions, which differ for different lines and vary linearly on the image.

7. An image reconstruction method according to claim 4, wherein said step of obtaining said first phase distortions includes a step of adding said first phase distortions obtained by forming said difference in the x direction to obtain the average thereof.

8. An image reconstruction method according to claim 6, wherein said step of obtaining said second phase distortions includes a step of presuming $\alpha$ by the method of least squares, said offset phase distortions being represented by using $G(y) = \alpha y^2$.

9. An image reconstruction method according to claim 4, wherein said step (a) includes a step of Fourier-transforming said hypothetical data in the X direction before said presuming step and said step (c) includes a step of Fourier-transforming said magnetic resonance signal in the X direction before said step of obtaining the phase.

10. An image reconstructing device for a magnetic resonance imaging device comprising:
    (a) means for storing phase distortions of a magnetic resonance signal in the form of a table prepared previously, by using a phase encode amount and an imaging region size as parameters;
    (b) means for correcting the phase distortions of said magnetic resonance signal on the basis of the phase distortions stored in said table for the measured magnetic resonance signal; and
    (c) means for reconstructing an image, starting from said magnetic resonance signal thus corrected.

11. An image reconstructing device according to claim 10, wherein said storing means includes means for storing offset phase distortions differing for every line and/or phase distortions, which differ for different lines and vary linearly on the image and said correcting means includes means for executing an operation for returning the amount of rotation of the phase appearing as said phase distortions to the original value.

12. An image reconstruction method according to claim 10, wherein said storing means includes a step of calculating the phase distortions corresponding to another imaging region size, starting from said phase distortions corresponding to different phase encode amounts belonging to said same imaging region size.

13. An image reconstructing device for a magnetic resonance imaging device comprising:
   (a) means for presuming data for $y<0$ by obtaining a complex conjugate from data for $y\geq 0$ among hypothetical data of a magnetic resonance signal including no phase distortions;
   (b) means for obtaining the phase of said presumed data;
   (c) means for obtaining the phase of said measured data in said region of $y<0$ in the real measured data of said magnetic resonance signal;
   (d) means for obtaining the difference between the phase of said presumed data and the phase of said measured data;
   (e) means for obtaining first phase distortions of said measured data in said region of $y<0$, starting from said difference;
   (f) means for obtaining second phase distortions of said measured data in said region of $y\geq 0$, starting from said first phase distortions;
   (g) means for correcting said phase distortions of said measured data by using said first phase distortions and second phase distortions; and
   (h) means for reconstructing an image by using said measured data thus corrected.

14. An image reconstruction device according to claim 13, wherein said correcting means includes means for executing an operation for returning the amount of rotation of the phase appearing as said phase distortions to the original value.

15. An image reconstruction device according to claim 13, wherein said means for obtaining said first phase distortions includes means for obtaining offset phase distortions differing for every line and/or phase distortions, which differ for different lines and vary linearly on the image.

16. An image reconstruction device according to claim 13, wherein said means for obtaining said first phase distortions includes means for adding said first phase distortions obtained by forming said difference in the X direction to obtain the average thereof.

17. An image reconstruction device according to claim 15, wherein said means for obtaining said second the method of least squares, said offset phase distortions being represented by using $G(y)=\alpha y^2$.

18. An image reconstruction method according to claim 13, wherein said means for presuming the data of $y<0$ from said hypothetical data includes:
   means for Fourier-transforming said hypothetical data in the X direction; and
   means for presuming the data of $y<0$ from the data after said Fourier transformation, and
   said means for obtaining the phase of said measured data includes:
   means for Fourier-transforming said magnetic resonance signal in the X direction; and
   means for obtaining said phase from the data after said Fourier transformation.

* * * * *